United States Patent [19]

Haas

[11] Patent Number: 4,806,192

[45] Date of Patent: Feb. 21, 1989

[54] METHOD FOR ETCHING MATERIALS

[75] Inventor: Rainer D. Haas, Herrenberg, Fed. Rep. of Germany

[73] Assignee: Hans Hollmuller Maschinenbau GmbH & Co., Fed. Rep. of Germany

[21] Appl. No.: 155,542

[22] Filed: Feb. 12, 1988

Related U.S. Application Data

[62] Division of Ser. No. 929,419, Nov. 12, 1986.

[30] Foreign Application Priority Data

Nov. 11, 1985 [DE] Fed. Rep. of Germany ....... 3539886

[51] Int. Cl.$^4$ ................................. C23F 1/02
[52] U.S. Cl. .................................... 156/345; 156/642; 134/2; 134/3; 134/10; 134/15; 204/129.35; 204/129.1; 204/130; 204/402
[58] Field of Search .................... 156/345, 642; 134/2, 134/3, 10, 15, 18; 204/129.35, 402, 129.6, 129.1, 130

[56] References Cited

U.S. PATENT DOCUMENTS

| | | | |
|---|---|---|---|
| 4,017,343 | 4/1977 | Haas | 134/10 |
| 4,051,001 | 9/1977 | Inoue et al. | 204/130 |
| 4,233,106 | 11/1980 | Goffredo | 134/10 |
| 4,385,969 | 5/1983 | Kastening et al. | 204/105 |

Primary Examiner—Kenneth M. Schor
Assistant Examiner—Lori-Ann Johnson
Attorney, Agent, or Firm—Fred Philpitt

[57] ABSTRACT

An apparatus for etching supports that have deposited thereon an etchable metal with an etching medium, which apparatus includes an etching chamber, means to convey the supports with metal deposited thereon through the etching chamber, a plurality of nozzles which are positioned to spray etching medium containing acid on the supports as they move through the etching chamber, a sump for receiving residual etching medium withdrawn from the etching chamber, a first circulating system for circulating residual etching medium from the sump back to the plurality of nozzles, a reservoir for an oxidizing agent, a device for regulating the addition of oxidizing agent into the circulating system in an amount which is stoichiometrically in excess of that required to remove metal from the supports, a chamber containing a metal which will react with the oxidizing agent, a second circulating system for circulating residual etching medium from the sump through the chamber containing a metal, a regenerating chamber to receive and regenerate the etching medium leaving the chamber containing a metal, and means to convey the etching medium regenerated in the regenerating chamber back to the sump.

6 Claims, 1 Drawing Sheet

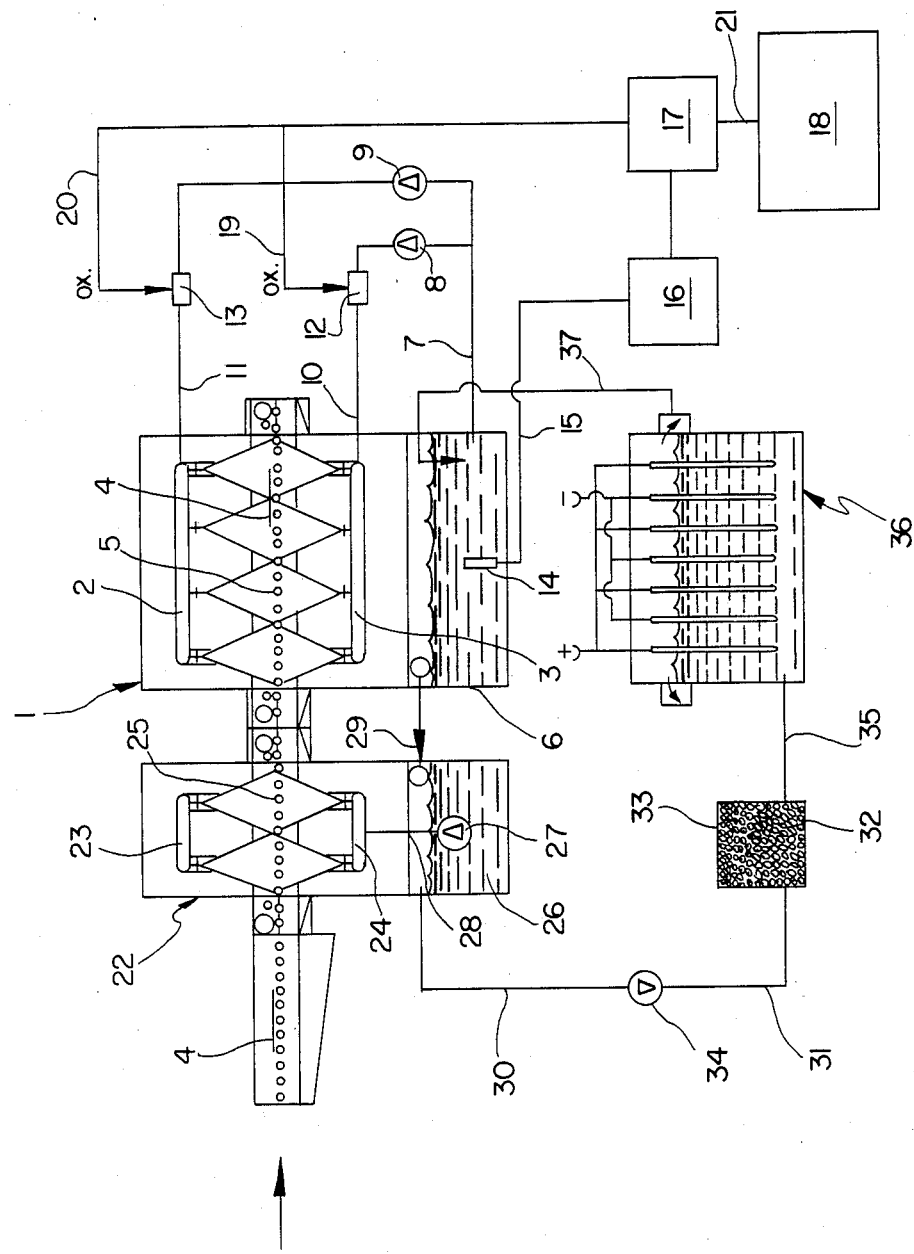

METHOD FOR ETCHING MATERIALS

This is a division of application Ser. No. 929,419, filed Nov. 12, 1986 and the benefits of 35 USC 120 are claimed relative to it.

The invention relates to a method for etching material to be etched, preferably printed circuit boards, consisting at least partly of metal, preferably of copper, with an etching medium containing an acid, preferably sulphuric acid, to which a certain quantity of oxidizing agent is added shortly before the actual etching operation, which quantity is in stoichiometric ratio with respect to the quantity of metal to be etched.

The invention also relates to an apparatus for carrying out this method with an etching machine, which comprises a plurality of nozzles and an etching medium sump, with a pump which removes the etching medium from the etching medium sump and supplies it to the nozzles by way of a device in which an oxidizing agent is added to the etching medium, with a device which controls the addition of oxidizing agent to the etching medium in stoichiometric dependence on the quantity of metal to be etched.

A method and apparatus of this type are known from EP A 00 53 719. In the latter copper is etched with sulphuric acid, to which hydrogen peroxide is added directly before the actual etching operating. Since it is known that hydrogen peroxide decomposes in the etching medium, which may lead to disturbances in the pump during circulation of the etching medium and moreover since hydrogen peroxide present in the etching medium is a drawback in the case of an electrolytic regeneration of the etching medium, it is attempted in EP-A 00 53 719 to add the hydrogen peroxide in an exact quantity corresponding stoichiometrically to the quantity of metal to be removed. However, in this case the danger exists that complete etching is not achieved with insufficient addition of the oxidizing agent and that on the other hand with even a slight excess of oxidizing agent, the undesirable difficulties connected with the presence of oxidizing agent in the etching solution again occur.

It is the object of the present invention to provide a method of the aforementioned type in which complete etching of the material to be etched is achieved reliably and nevertheless the disturbing effects of the oxidizing agent in the etching medium are avoided.

This object is achieved according to the invention due to the fact that slightly more oxidizing agent is added than corresponds stoichiometrically exactly to the quantity of metal to be removed and that the oxidizing agent which remains after the etching reaction is removed from the etching medium which has drained from the material to be etched due to the fact that this etching medium is passed over an excess of metal which can be etched.

Thus, according to the invention, due to a stoichiometric excess of oxidizing agent it is first of all ensured that etching of the material to be etched may in fact take place completely. This excess of oxidizing agent is naturally kept as low as possible. It is then removed from the etching medium due to the fact that the reactivity is completely removed from the latter by an excess of metal which can be etched, which exhausts itself and the oxidizing agent. In this way the operating capacity of the circulating pumps is completely maintained. The operation of an electrolytic regeneration system for the etching medium is not impaired by residual oxidizing agent.

Preferably the material of which the excess of metal which can be etched consists, is the same metal of which the material to be etched consists at least partly. Due to this the preparation and regeneration of the etching medium is considerably facilitated. Hydrogen peroxide or even ozone may preferably be used as oxidizing agents.

Furthermore it is the object of the present invention to develop an apparatus of the aforementioned type so that reliable, complete etching of the material to be etched takes place, but at the same time disturbances in the operation of the circulating pumps and/or of the electrolytic regeneration system for the etching medium are avoided.

This object is achieved according to the invention due to the fact that the device regulating the addition of oxidizing agent is designed so that the oxidizing agent is added in larger quantities than corresponds stoichiometricaly to the quantity of metal to be removed and that at least one device is provided to which etching medium containing the residual oxidizing agent is supplied from the etching medium sump of the etching machine and in which an excess of metal which can be etched is acted upon by the etching medium.

For the reasons already mentioned above, it is advantageous if the material of which the excess of metal which can be etched consists is the same metal of which the material to be etched consists at least partly.

The device in which an excess of material which can be etched is acted upon by the etching medium containing residual oxidizing agent may be a preliminary etching unit similar to an etching machine, whereof the sump is connected to the sump of the etching machine and which precedes the etching machine, in which case no oxidizing agent is added to the etching medium in the preliminary etching unit. In this way the excess of metal which can be etched is formed by the metal of the material to be etched itself, which is still available in a large quantity in the preliminary etching unit. Moreover, in this way it results that the excess of metal which can be etched and the metal to be etched correspond chemically.

Alternatively, a container filled with fine metal particles may simply be the device in which an excess of material which can be etched is acted upon by the etching medium containing residual oxidizing agent.

In any case, for the protection of the particularly sensitive electrolytic cell of regeneration systems, it is an advantage if the device in which an excess of material which can be etched is acted upon by the etching medium containing the residual oxidizing agent, is located in the supply pipe to the electrolytic cell.

One embodiment of the invention will be described in detail hereafter with reference to the drawing.

The single figure shows an etching system with electrolytic regeneration of the etching medium diagrammatically.

In the drawing the actual etching machine is designated by the reference numeral 1, which comprises an upper bank of nozzles 2 comprising a plurality of nozzles and a lower bank of nozzles 3 likewise comprising a plurality of nozzles. The material to be etched 4, for example a circuit board coated with copper and masked accordingly, is guided through the etching machine 1 on a roller belt (shown diagrammatically) from left to right in the drawing and is thus sprayed from above and below from the banks of nozzles 2 and 3 with liquid etching medium containing sulphuric acid.

An etching medium sump 6 is located in the lower region of the etching machine 1. A removal pipe 7 leads from the etching medium sump 6 to the suction side of two pumps 8 and 9, whereof the outlets are connected to the banks of nozzles 3 and 2 by way of pipes 10 and 11 and by way of oxidizing agent injectors 12 and 13 located in the pipes 10 and 11. Located in the etching medium sump 6 of the etching machine 1 is a probe 14, which monitors the concentration of the oxidizing agent in the accumulating etching medium in a suitable, known manner, for example electrometrically. The probe 14 is connected by way of an electric lead 15 to a control unit 16, which in turn acts on a metering device 17. According to the signals of the control unit 16, the metering device 17 removes oxidizing agent from a supply tank 18 by way of the pipe 21 and supplies it by way of the pipes 19 and 20 to the injectors 12, 13.

Preceding the etching machine 1 is a preliminary etching unit 22, through which the material 4 to be etched passes prior to the etching machine 1. The preliminary etching unit 22 is constructed as a small etching machine. It likewise comprises an upper bank of nozzles 23, a lower bank of nozzles 24, a roller bed 25 and in the lower region an etching medium sump 26, in which etching medium containing sulphuric acid collects.

A pump 27 removes etching medium from the etching medium sump 26 and supplies the latter by way of a pipe 28 directly to the two banks of nozzles 23 and 24. Any possibility of adding oxidizing agent is not provided in the preliminary etching unit 22.

The etching medium sump 26 of the preliminary etching unit 22 is fed by way of an overflow pipe 29, which connects the etching medium sump 6 of the etching machine 1 to the etching medium sump 26 of the preliminary etching unit 27.

The suction side of a pump 34 is connected by way of a removal pipe 30 to the etching medium sump 26 of the preliminary etching unit 22. The outlet of the pump 34 leads by way of a pipe 31 to a container 32, which is filled with fine metal particles 33 offering a large surface area. The metal of which these particles 33 consists, is the same as the material 4 to be etched.

The outlet of the container 32 is connected by way of a pipe 35 to the inlet of an electrolytic cell 36, from which regenerated etching medium is again supplied by way of a pipe 37 to the etching medium sump 6 of the etching machine 1.

The operation of the afore-described etching system is as follows:

In contrast to known etching systems, when the oxidizing agent is added by way of the injectors 12, 13 to the etching medium, it is not attempted to maintain exactly that quantity which is necessary stoichiometrically for etching the entire quantity of metal to be removed from the material to be etched. On the contrary, a small, even the smallest possible excess quantity of oxidizing agent is ensured by way of the probe 14, the appropriately programmed control unit 16 and the metering device 17. The oxidizing agent is thus not completely used up during the etching operation, but can be detected in small quantities in the etching medium sump 6. However, in order that it does not become concentrated in the etching medium sump 6, which would lead to damage and operating disturbances to the pumps 8, 9 and in particular to the electrolytic cell 36, the preliminary etching unit 22 and the container 32 filled with metal particles 33 are provided. Both represent devices with which residual oxidizing agent can be removed from the etching medium, which is removed from the etching medium sump 6 of the etching machine 1. This takes place due to the fact that an excess of metal is offered to the oxidizing agent, which is etched partly using up the residual oxidizing agent. In the case of the preliminary etching unit 22, this function is taken over by the metal of the material 4 to be etched itself, in the case of the container 32 it is taken over by the metal particles 33 located therein.

In practice, in many cases it is not necessary to provide both a preliminary etching unit 22 as well as a container 32 filled with metal. On the contrary, frequently one of these devices is completely adequate, which is preferably incorporated in the supply pipe 31, 35 of the electrolytic cell 36 which has to be especially protected from oxidizing agent.

Moreover, the electrolytic regeneration of the etching medium in the electrolytic cell 36 takes place in known manner and does not need to be described here in more detail. In this case, bipolar electrodes are preferably used.

The term "etching" was used previously in a way which includes not only the complete through-etching of a metal layer, but also the initial etching of a metal up to a certain depth.

I claim:

1. Apparatus for etching supports that have deposited thereon an etchable metal with an etching medium, which apparatus includes:
    (a) an etching chamber including means to introduce an etching medium,
    (b) means to convey supports with metal deposited thereon through said etching chamber,
    (c) a plurality of nozzles which are positioned to spray etching medium containing acid on said supports as they move through said etching chamber,
    (d) a sump for receiving residual etching medium withdrawn from said etching chamber,
    (e) a first circulating system constructed and arranged for circulating residual etching medium from said sump back to said plurality of nozzles,
    (f) a reservoir containing an oxidizing agent,
    (g) a device for introducing and regulating the addition of oxidizing agent into the circulating system set forth in (e) in an amount which is stoichiometrically in excess of that required to remove metal from said supports,
    (h) a chamber containing a metal which will react with said oxidizing agent,
    (i) a second circulating system constructed and arranged for circulating residual etching medium from said sump set forth in (d) through said chamber set forth in (h),
    (j) a regenerating chamber arranged to receive and regenerate the etching medium leaving the chamber set forth in (h), and
    (k) means to convey the etching medium regenerated in said regenerating chamber back to the sump set forth in (d).

2. An apparatus according to claim 1 wherein the chamber set forth in (h) is a preliminarily etching chamber located in advance of the etching chamber set forth in (a) and means are provided to convey said supports into said preliminary etching chamber.

3. An apparatus according to claim 2 which includes a housing containing a mass of metal particles together with means to pass etching medium leaving said preliminary etching chamber through said housing and then to said regenerating chamber.

4. An apparatus according to claim 1 wherein said regenerating chamber is an electrolytic cell.

5. An apparatus according to claim 4 wherein the electrodes of the electrolytic cell are bipolar electrodes.

6. An apparatus according to claim 3 wherein said metal in said mass of metal particles is the same metal that is on said supports.

* * * * *